(12) United States Patent
Lin et al.

(10) Patent No.: US 12,074,063 B2
(45) Date of Patent: Aug. 27, 2024

(54) CONTACT FORMATION METHOD AND RELATED STRUCTURE

(71) Applicant: Taiwan Semiconductor Manufacturing Company, Ltd., Hsinchu (TW)

(72) Inventors: Shih-Che Lin, Hsinchu (TW); Chao-Hsun Wang, Taoyuan County (TW); Chia-Hsien Yao, Hsinchu (TW); Fu-Kai Yang, Hsinchu (TW); Mei-Yun Wang, Hsinc-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 232 days.

(21) Appl. No.: 17/461,638

(22) Filed: Aug. 30, 2021

(65) Prior Publication Data

US 2023/0065045 A1    Mar. 2, 2023

(51) Int. Cl.
*H01L 21/768* (2006.01)
*H01L 23/528* (2006.01)
*H01L 23/535* (2006.01)

(52) U.S. Cl.
CPC .. *H01L 21/76895* (2013.01); *H01L 21/76805* (2013.01); *H01L 21/76816* (2013.01); *H01L 21/76831* (2013.01); *H01L 21/7684* (2013.01); *H01L 21/76843* (2013.01); *H01L 23/5283* (2013.01); *H01L 23/535* (2013.01)

(58) Field of Classification Search
CPC ......... H10L 21/76895; H10L 21/76805; H10L 21/76816; H10L 21/76831; H10L 21/7684; H10L 21/76843; H10L 21/76832; H10L 21/76883; H10L 21/76834; H10L 21/76897; H01L 23/5283; H01L 23/535
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |

(Continued)

*Primary Examiner* — Shahed Ahmed
*Assistant Examiner* — Vicki B. Booker
(74) *Attorney, Agent, or Firm* — Haynes and Boone, LLP

(57) ABSTRACT

A method and structure for forming a semiconductor device includes etching back a source/drain contact to define a substrate topography including a trench disposed between adjacent hard mask layers. A contact etch stop layer (CESL) is deposited along sidewall and bottom surfaces of the trench, and over the adjacent hard mask layers, to provide the CESL having a snake-like pattern disposed over the substrate topography. A contact via opening is formed in a dielectric layer disposed over the CESL, where the contact via opening exposes a portion of the CESL within the trench. The portion of the CESL exposed by the contact via opening is etched to form an enlarged contact via opening and expose the etched back source/drain contact. A metal layer is deposited within the enlarged contact via opening to provide a contact via in contact with the exposed etched back source/drain contact.

20 Claims, 10 Drawing Sheets

(56) References Cited

U.S. PATENT DOCUMENTS

| | | | |
|---|---|---|---|
| 9,236,300 B2 | 1/2016 | Liaw | |
| 9,520,482 B1 | 12/2016 | Chang et al. | |
| 9,576,814 B2 | 2/2017 | Wu et al. | |
| 2015/0364371 A1* | 12/2015 | Yen | H01L 21/7685 |
| | | | 438/666 |
| 2016/0379925 A1* | 12/2016 | Ok | H01L 21/76802 |
| | | | 438/666 |
| 2018/0151560 A1* | 5/2018 | Hsu | H01L 29/78 |

* cited by examiner

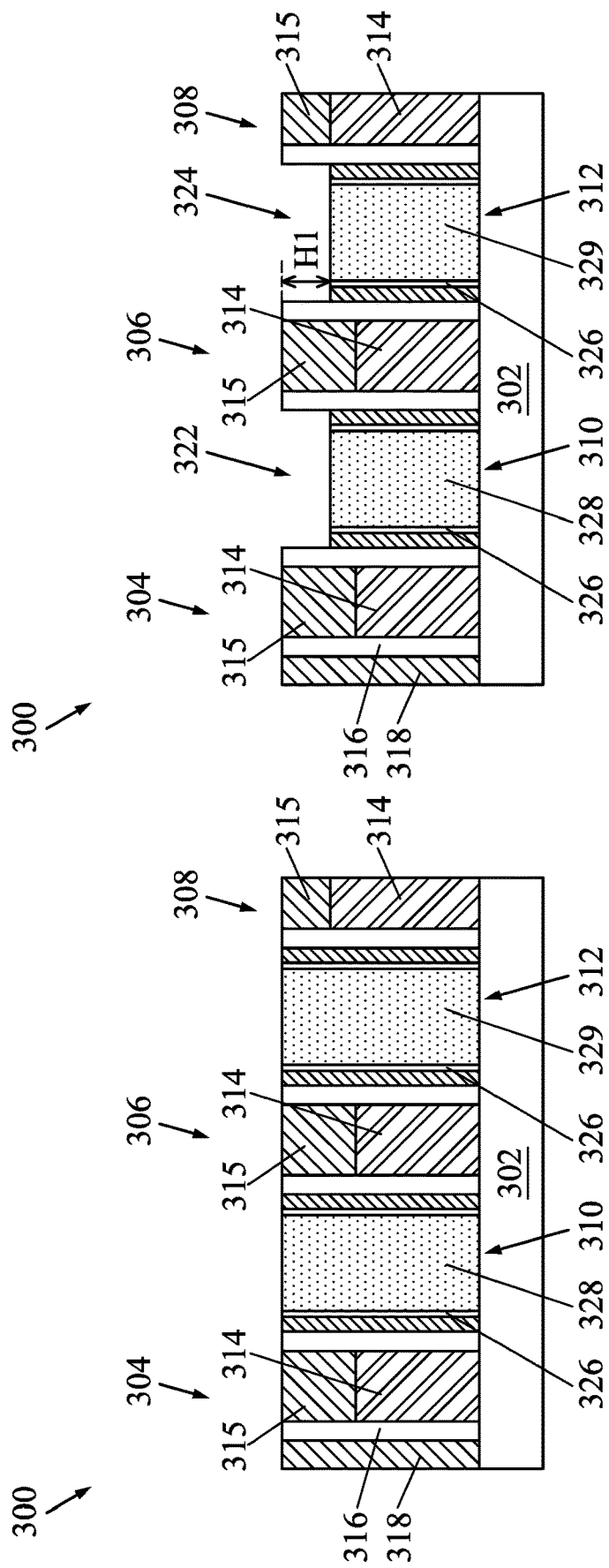

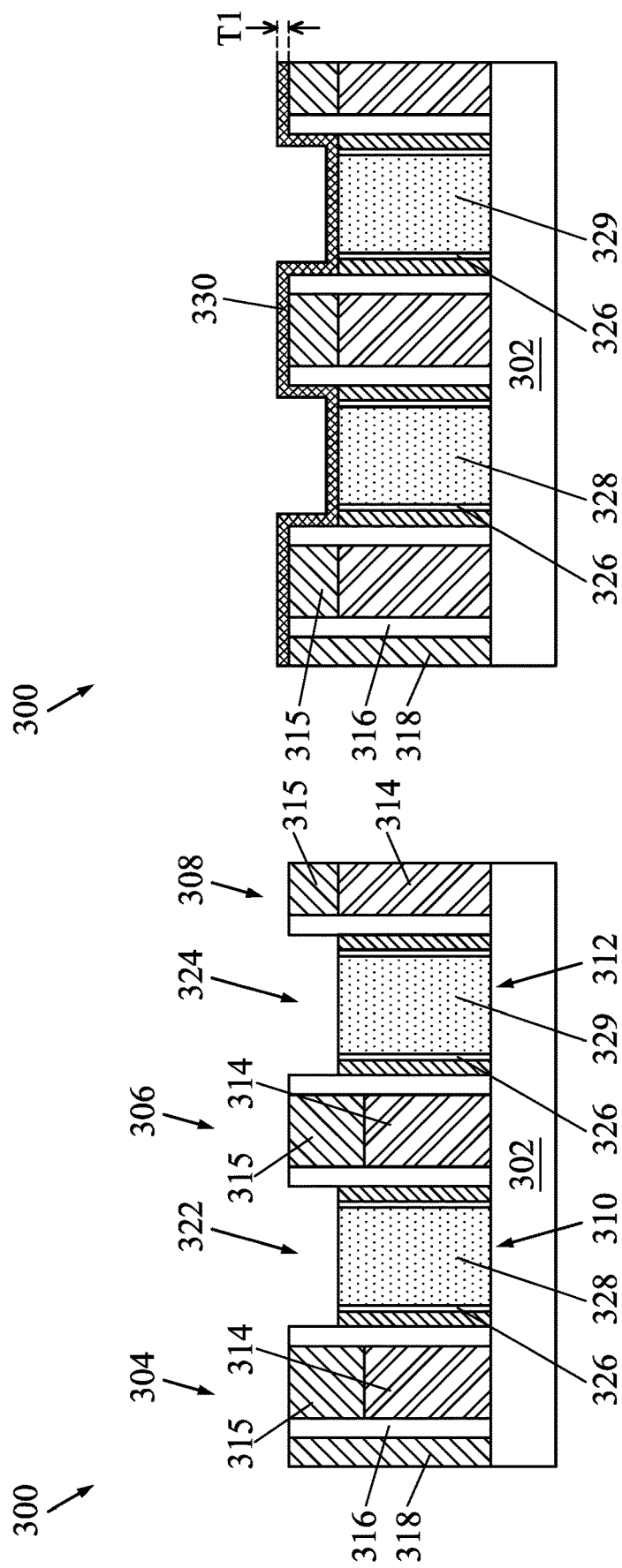

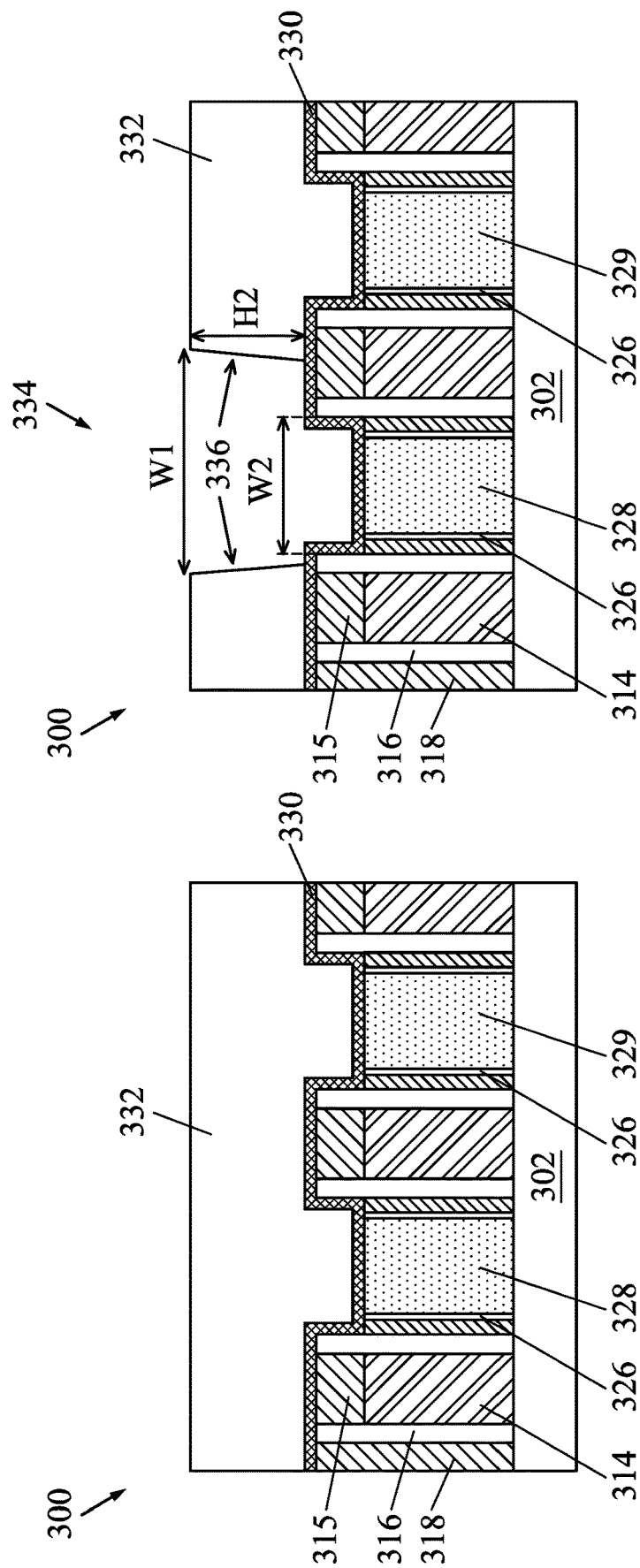

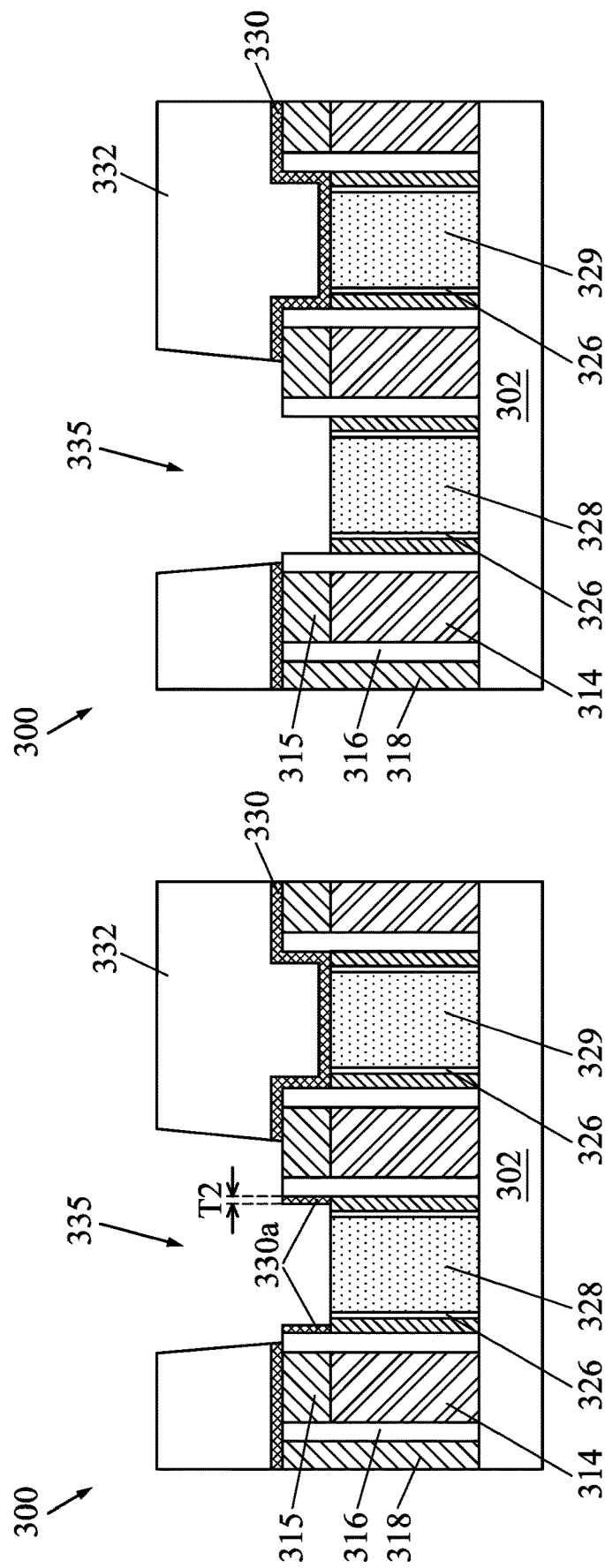

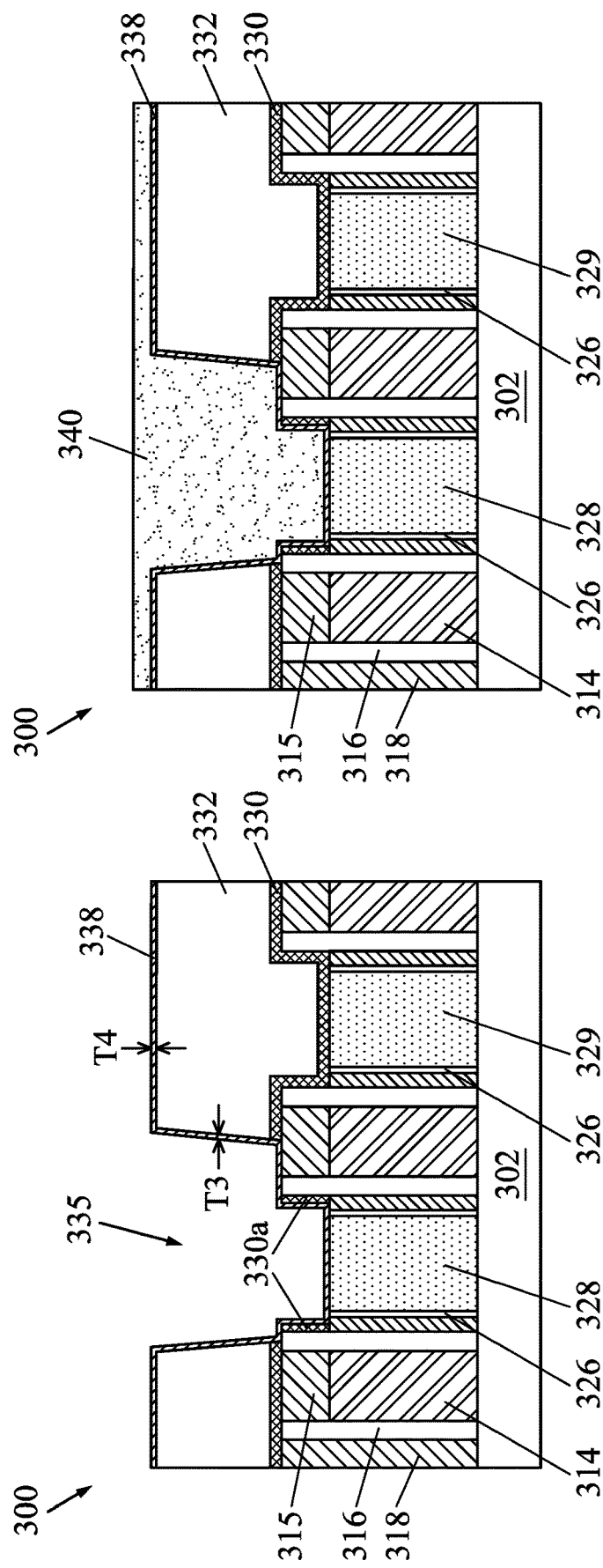

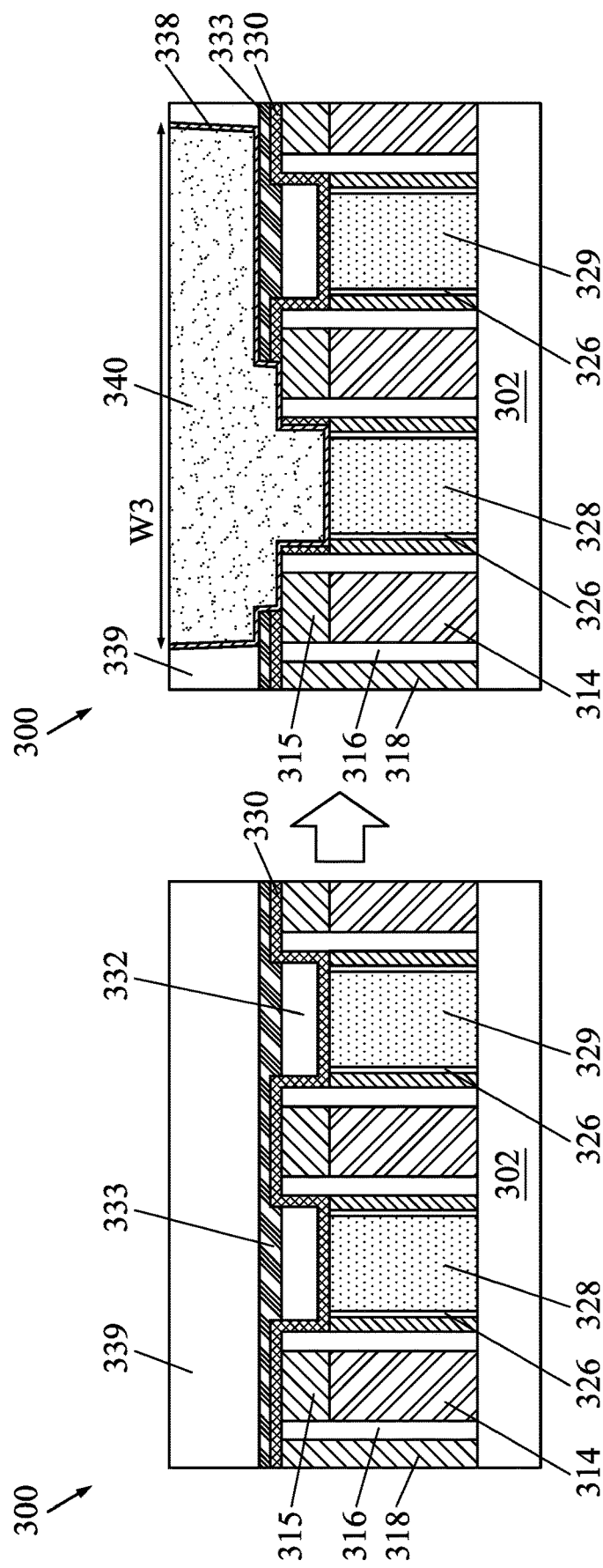

CONTACT FORMATION METHOD AND RELATED STRUCTURE

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, forming a reliable contact to a metal layer (e.g., to a source, drain, and/or body region), requires reliable and low resistance via structures such as contact vias. For at least some processes, the resistance of via structures remains a device reliability issue, especially with the continued scaling of IC dimensions. In some cases, a thick glue layer (e.g., deposited prior to formation of a metal via layer) may result in poor metal gap fill, thus leading to high via resistance. Enlarging a critical dimension (CD) of a via, such as a contact via, is crucial for improving metal gap fill and lowering resistance. However, in some cases, etching to form a via trench (e.g., within which a metal layer will be deposited to form a conductive contact via) may etch both a first hard mask layer disposed over a metal gate and a second hard mask layer over a source/drain contact. The etching of both the first and second hard mask layers is due to the lack of etch selectivity between the first and second hard mask layers, which may include two different kinds of hard mask materials. As a result, the metal layer deposited in the via trench to form the conductive contact via may form a short-circuit path between the source/drain contact and the metal gate. In addition, processes that employ such first and second hard mask layers may also suffer from unintentional thinning of at least one of the first and second hard mask layers, for example, due to the additional chemical mechanical polishing (CMP) process that is needed for the two different kinds of hard mask layers. Further, when a sidewall spacer on a sidewall of the metal gate is too thin and an adjacent hard mask layer is conductive, voltage breakdown of the sidewall spacer may occur.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, and 13 provide cross-sectional views of a device at intermediate stages of fabrication and processed in accordance with the method of FIG. 2, along a plane substantially parallel to a plane defined by section AA' of FIG. 1B, according to some embodiments; and FIGS. 14 and 15 provide cross-sectional views of another device at intermediate stages of fabrication and processed in a manner similar to that described with reference to the method of FIG. 2, along a plane substantially parallel to a plane defined by section AA' of FIG. 1B, according to some embodiments.

DETAILED DESCRIPTION

Figure 1A:
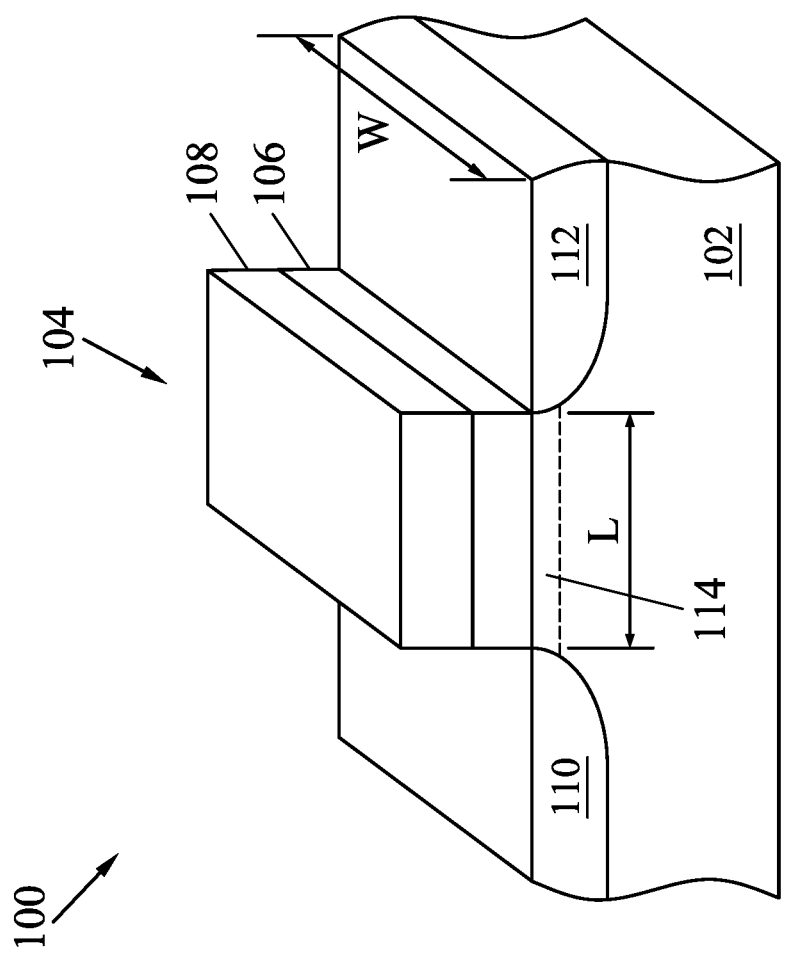
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of contact vias which may be employed in any of a variety of device types. For example, embodiments of the present disclosure may be used to form contact vias in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, or other devices as known in the art. In some cases, embodiments of the present disclosure may also be used to form gate vias. In addition, embodiments disclosed herein may be employed in the formation of P-type and/or N-type devices. One of ordinary skill may recognize other embodiments of semiconductor devices that may benefit from aspects of the present disclosure.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 106. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-K dielectric layer such as hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown source/drain regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and an intrinsic hole mobility at room temperature (300 K) of around 480 $cm^2$/V-s.

Figure 1B:
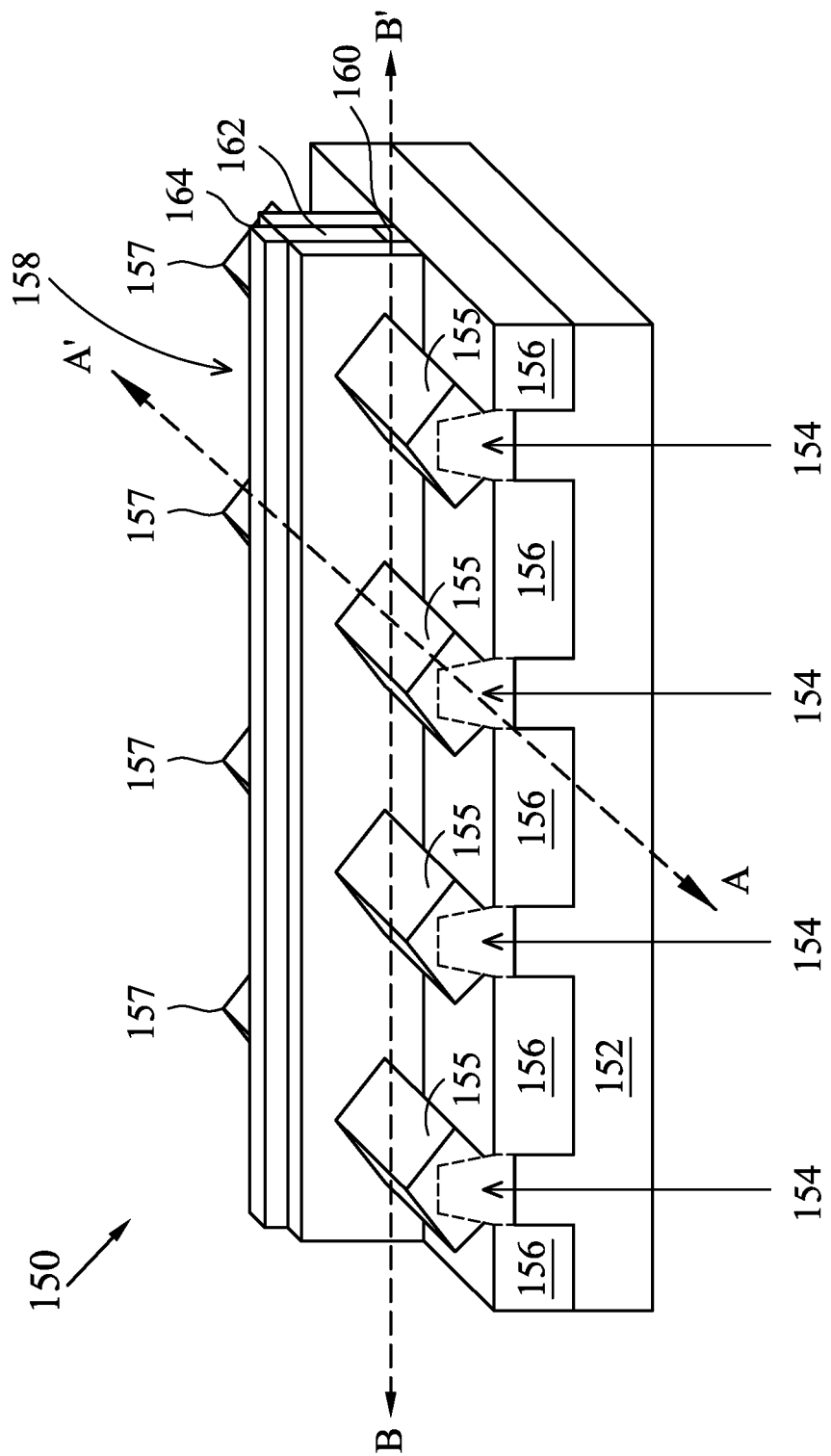
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin element 154. The substrate 152 may be a semiconductor substrate such as a silicon substrate. In various embodiments, the substrate 152 may be substantially the same as the substrate 102 and may include one or more of the materials used for the substrate 102, as described above.

The fin element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate while an etch process forms recesses into the silicon layer, thereby leaving an extending fin element 154. The recesses may be etched using a dry etch (e.g., chemical oxide removal), a wet etch, and/or other suitable processes. Numerous other embodiments of methods to form the fin elements 154 on the substrate 152 may also be used.

Each of the plurality of fin elements 154 also include a source region 155 and a drain region 157 where the source/drain regions 155, 157 are formed in, on, and/or surrounding the fin element 154. The source/drain regions 155, 157 may be epitaxially grown over the fin elements 154. In addition, a channel region of a transistor is disposed within the fin element 154, underlying the gate structure 158, along a plane substantially parallel to a plane defined by section AA' of FIG. 1B. In some examples, the channel region of the fin element 154 includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation regions 156 are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-K dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more contact vias, embodiments of which are described in more detail below. In some examples, the contact vias described herein may be part of a local interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of back-end-of-line (BEOL) fabrication processes and include a multi-level network of metal wiring. Moreover, any of a plurality of IC circuits and/or devices (e.g., such as the transistor 100 or FinFET 150) may be connected by such interconnects.

With the aggressive scaling and ever-increasing complexity of advanced IC devices and circuits, contact and local interconnect design has proved to be a difficult challenge. By way of example, forming a reliable contact to a metal layer (e.g., to a source, drain, and/or body region), requires reliable and low resistance via structures such as contact vias. For at least some processes, the resistance of via structures remains a device reliability issue, especially with the continued scaling of IC dimensions. In some examples, a thick glue layer (e.g., deposited prior to formation of a metal via layer) may result in poor metal gap fill, thus leading to high via resistance. Enlarging a critical dimension (CD) of a via, such as a contact via, is crucial for improving metal gap fill and lowering resistance. However, in some cases, etching to form a via trench (e.g., within which a metal layer will be deposited to form a conductive contact via) may etch both a first hard mask layer disposed over a metal gate and a second hard mask layer over a source/drain contact. The etching of both the first and second hard mask layers is due to the lack of etch selectivity between the first and second hard mask layers, which may include two different kinds of hard mask materials. As a result, the metal layer deposited in the via trench to form the conductive contact via may form a short-circuit path between the source/drain contact and the metal gate. In addition, processes that employ such first and second hard mask layers may also suffer from unintentional thinning (loss) of at least one of the first and second hard mask layers, for example, due to the additional CMP process that is needed for the two different kinds of hard mask layers. Further, when a sidewall spacer on a sidewall of the metal gate is too thin and an adjacent hard mask layer is conductive, voltage breakdown of the sidewall spacer may occur. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a fabrication process for contact structures and including contact vias. In at least some embodiments, a self-aligned contact via with an enlarged CD is provided. In various examples, the disclosed contact via may be formed without the use of multiple hard mask layers of different types. In some embodiments, a first hard mask layer is formed over a metal gate, and instead of forming a second hard mask layer over a source/drain contact, the source/drain contact may be etched back to form a substrate topography that includes a plurality of trenches interposing the first hard mask layer. Thereafter, a contact etch stop layer (CESL) is formed conformally over the substrate topography such that the CESL is deposited in a snake-like pattern that oscillates up and down over the substrate topography. After formation of the snaking CESL, a dielectric layer may be formed, a via trench is formed, and a metal layer is deposited in the via trench to form a conductive contact via. By employing the snaking CESL, which enables the use of a single hard mask layer (e.g., over the metal gate), there is no lack of etch selectivity (e.g., between multiple hard mask layers of different types) and the etch process is thus more reliable. Further, use of the single hard mask layer also removes the need for an additional CMP process, thereby avoiding the unintentional thinning (loss) of the hard mask. The snaking CESL additionally provides for increased protection of the metal gate sidewall spacer, mitigating potential voltage breakdown of the sidewall spacer. More generally, the embodiments disclosed herein provide for a more reliable, low-resistance contact via with a large CD (e.g., made possible by the snaking CESL), where the low-resistance contact via may be formed at a reduced cost (e.g., by eliminating the additional hard mask layer and associated process steps). Additional details of embodiments of the present disclosure are provided below, and additional benefits and/or other advantages will become apparent to those skilled in the art having benefit of the present disclosure.

Figure 2:
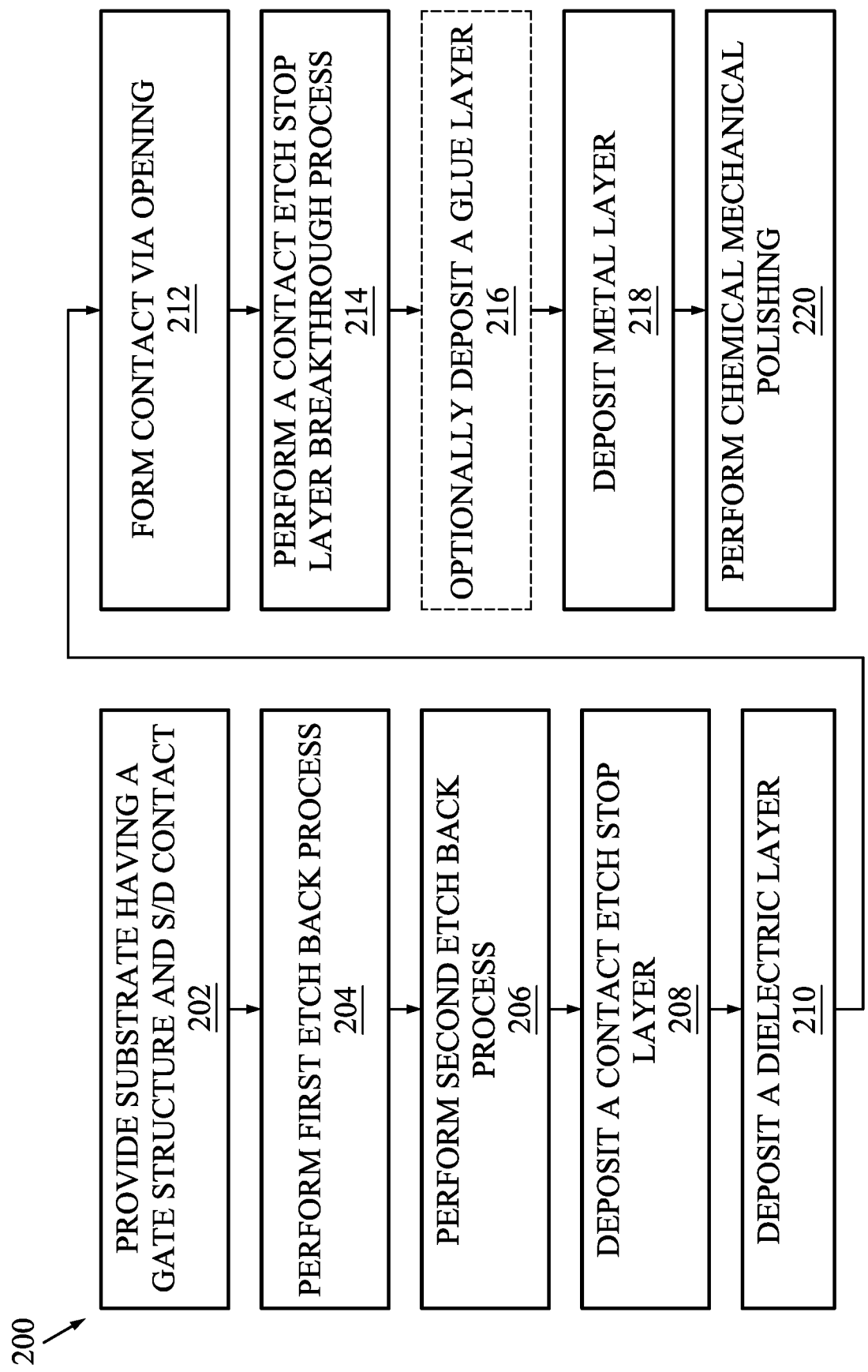
FIG. 2 is a flow chart of a method of forming contact structures and including contact vias, according to some embodiments.

Referring now to FIG. 2, illustrated is a method 200 of forming contact structures and including contact vias, in accordance with some embodiments. The method 200 is described below in more detail with reference to FIGS. 3-13, which provide cross-sectional views of a device 300 along a plane substantially parallel to a plane defined by section AA' of FIG. 1B. The method 200 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200 may be implemented on other devices such as GAA devices, Ω-gate devices, or Π-gate devices, as well as strained-semiconductor devices, SOI devices, PD-SOI devices, FD-SOI devices, or other devices as known in the art.

It is understood that parts of the method 200 and/or any of the exemplary transistor devices discussed with reference to the method 200 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), MOSFETs, CMOS transistors, bipolar transistors, high voltage transistors, high frequency transistors, other memory cells, and/or combinations thereof.

The method 200 begins at block 202 where a substrate having a gate structure and source/drain (S/D) contacts is provided. With reference to FIG. 3, and in an embodiment of block 202, a device 300 having a substrate 302 and including gate structures 304, 306, 308, and source/drain contacts 328, 329 is provided. In some embodiments, the substrate 302 may be substantially the same as either of the substrates 102, 152, described above. A region of the substrate 302 upon which the gate structures 304, 306, 308 are formed, and including regions of the substrate 302 between adjacent gate structures 304, 306, 308, may include an active region of the substrate 302. It will be understood that the device 300 is merely illustrative and is provided for clarity of discussion with respect to the method 200. For example, in some cases, the device 300 may include a planar device, such as the transistor 100. Alternatively, in some examples, the device 300 may include a multi-gate device, such as the FinFET 150. Moreover, in some cases, the device 300 may include a GAA device, an Ω-gate device, a Π-gate device, a strained-semiconductor device, an SOI device, a PD-SOI device, a FD-SOI device, or other device as known in the art. In some embodiments, the device 300 includes regions 310, 312, adjacent to the gate structures 304, 306, 308, where the regions 310, 312 may include a source region, a drain region, or a body contact region. In various embodiments, each of the gate structures 304, 306, 308 may include an interfacial layer formed over the substrate 302, a gate dielectric layer formed over the interfacial layer, and a metal gate (MG) layer 314 formed over the gate dielectric layer. In some embodiments, each of the interfacial layer, the dielectric layer, and the metal gate layer 314 of the gate structures 304, 306, 308 may be substantially the same as those described above with respect to the transistor 100 and the FinFET 150. In addition, each of the gate structures 304, 306, 308 may include sidewall spacer layers 316, 318. In some cases, each of the sidewall spacer layers 316, 318 include materials having different dielectric constant values (e.g., K values). In various embodiments, the sidewall spacer layers 316, 318 include $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric materials. In some embodiments, the sidewall spacer layers 316, 318 include multiple layers, such as main spacer walls, liner layers, and the like. By way of example, the sidewall spacer layers 316, 318 may be formed by depositing a dielectric material over the device 300 and anisotropically etching back the dielectric material. In some embodiments, the etch back process (e.g., for spacer formation) may include a multiple-step etching process to improve etch selectivity and provide over-etch control.

In some embodiments, the metal gate layer 314 of the gate structures 304, 306, 308 may be etched back (e.g., using a wet etch, dry etch, or a combination thereof) to form a trench, within which a hard mask layer 315 is subsequently formed. In some embodiments, the hard mask layer 315 may include a silicon nitride layer such as $Si_3N_4$, silicon oxynitride, silicon carbide, and/or a pad oxide layer such as $SiO_2$. The hard mask layer 315 may be deposited by CVD, PVD, ALD, or by another suitable process. Thus, after formation of the hard mask layer 315 and in some embodiments, the sidewall spacer layers 316, 318 are disposed along sidewalls of the hard mask layer 315. In various examples, the hard mask layer 315 may serve to protect the metal gate layer 314 of the gate structures 304, 306, 308 during subsequent processing. It is noted that in some cases, as shown in the illustrated embodiments, at least some of the metal gate layers 314 of the gate structures 304, 306, 308 may have different heights (e.g., due to process variations such as the etch back of the metal gate layer 314). However, even for cases where the metal gate layers 314 have different heights, the metal gate layers 314 of the gate structures 304, 306, 308 will have heights that are within about 5 nm of each other. In some examples, at least some of the metal gate layers 314 of the gate structures 304, 306, 308 may have the same heights.

In a further embodiment of block 202, and still with reference to FIG. 3, the device 300 may further include source/drain contacts 328, 329, as noted above. In some embodiments, the source/drain contacts 328, 329 may be formed by forming a dielectric layer, such as an inter-layer dielectric (ILD) layer, over the substrate 302 and over each of the gate structures 304, 306, 308. Thereafter, a pattern is formed in the dielectric layer, where the pattern includes openings that expose/provide access to regions 310, 312, adjacent to the gate structures 304, 306, 308. As previously discussed, the regions 310, 312 may include a source region, a drain region, or a body contact region. By way of example, the openings in the dielectric layer may be formed by a suitable combination of lithographic patterning and etching (e.g., wet or dry etching) processes. In some cases, such openings may be referred to as metal plug openings, contact plug openings, or plug openings. After forming the openings to expose the regions 310, 312, a silicidation process may initially be performed to form a silicide layer on exposed portions of the substrate 302 in the regions 310, 312, thereby providing a low resistance contact thereto. In some examples, a glue or barrier layer 326 may be formed on sidewall surfaces of the openings which expose the regions 310, 312. The glue or barrier layer 326 may include Ti, TiN, Ta, TaN, W, or other appropriate material. Additionally, after forming the glue or barrier layer 326, metal layers 328, 329 may be formed. In some examples, the metal layers 328, 329 may include W, Cu, Co, Ru, Al, Rh, Mo, Ta, Ti, TiN, TaN, WN, silicides, or other suitable conductive material. In some cases, the metal layers 328 and 329 may include the same material and may deposited together as part of a single deposition process. In some cases, the metal layers 328, 329 may be referred to as metal plugs, contact plugs, plugs, or source/drain contacts. After deposition of the metal layers 328, 329, a CMP process may be performed to remove excess material and planarize the top surface of the device 300.

The method 200 then proceeds to block 204 where a first etch back process is performed. With reference to FIGS. 3 and 4, in an embodiment of block 204, a first etch back process is performed to recess the source/drain contacts 328, 329 and form trenches 322, 324. The first etch back process of block 204 may include a wet etching process, a dry etching process, or a combination thereof. In some embodiments, the first etch back process of block 204 is selective to the source/drain contacts 328, 329 such that neighboring layers (e.g., the sidewall spacer layers 316, 318 and the hard mask layers 315) remain substantially unetched. In some cases, the first etch back process of block 204 may optionally etch the glue or barrier layer 326 from sidewalls of the trenches 322, 324, thereby exposing the sidewall spacer layer 318 along sidewalls of the trenches 322, 324. In some embodiments, the first etch back process of block 204 may recess the source/drain contacts 328, 329 by a height 'H1'. In some examples, the first etch back height 'H1' may be in a range of between about 5 nm-40 nm. In some cases, if the first etch back height 'H1' is greater than about 40 nm, a subsequently deposited dielectric layer 332 may be under etched during formation of a contact via opening (block 212), preventing exposure of an underlying contact etch stop layer (CESL) 330 and preventing subsequent removal of a portion of the CESL 330 (block 214) which should have been exposed by the contact via opening 334. In some embodiments, if the first etch height 'H1' is less than about 5 nm, a subsequently deposited dielectric layer may be insufficient to protect the source/drain contacts 328, 329, which may result in an undesirable short-circuit. The first etch back height 'H1' at least partially defines the snake-like pattern of the subsequently deposited CESL, as discussed below. Further, the first etch back process of block 204 may be described as defining a substrate topography that includes a plurality of trenches (e.g., the trenches 322, 324) interposing the hard mask layers 315.

The method 200 proceeds to block 206 where a second etch back process is performed. Referring to FIGS. 4 and 5, in an embodiment of block 206, a second etch back process is performed to recess portions of the sidewall spacer layer 318 that were exposed by the first etch back process (block 204) to enlarge the trenches 322, 324 and expose the sidewall spacer layer 316 along sidewalls of the enlarged trenches 322, 324. Stated another way, the second etch back process of block 206 may effectively remove the portions of the sidewall spacer layer 318 disposed on sidewalls of the trenches 322, 324. In some examples, if the glue or barrier layer 326 was not removed during the first etch back process (block 204), then the glue or barrier layer 326 may be etched from sidewalls of the trenches 322, 324 prior to recessing the portions of the sidewall spacer layer 318. The second etch back process of block 206 may include a wet etching process, a dry etching process, or a combination thereof. In some embodiments, the second etch back process of block 206 is selective to the sidewall spacer layer 318 such that neighboring layers (e.g., the sidewall spacer layer 316 and the hard mask layers 315) remain substantially unetched. In some embodiments, and after performing the second etch back process of block 206, a top surface of the recessed sidewall spacer layer 318 may be substantially level (co-planar) with a top surface of the recessed source/drain contacts 328, 329. In addition, while the second etch back process of block 206 may enlarge the trenches 322, 324, the substrate topography may still be described as including a plurality of trenches (e.g., the enlarged trenches 322, 324) interposing the hard mask layers 315.

The method 200 proceeds to block 208 where a contact etch stop layer is deposited over the substrate. Referring to FIGS. 5 and 6, and in an embodiment of block 208, a CESL 330 is formed over the substrate 302. In various embodiments, the CESL 330 may be conformally deposited over the substrate topography defined by the first etch back process (block 204) and the second etch back process (block 206), as described above. Stated another way, the CESL 330 is deposited within the enlarged trenches 322, 324 (including over the recessed source/drain contacts 328, 329, the recessed sidewall spacer layer 318, and along the sidewall surface of the exposed sidewall spacer layer 316), and over top surfaces of both the sidewall spacer layer 316 and the hard mask layers 315 that interpose the enlarged trenches 322, 324. As a result, the CESL 330 defines a snake-like pattern that oscillates up and down over the substrate topography. In some examples, the CESL 330 may have a thickness 'T1' in a range of between about 1 nm-10 nm. In some cases, if the thickness 'T1' is less than about 1 nm, a subsequent via etch process (block 212) may not stop on the CESL 330, which may cause loss of the hard mask layers 315 and result in a via-to-metal gate short. In some embodiments, if the thickness 'T1' is greater than about 10 nm, the CESL 330 formed on sidewalls of the enlarged trenches 322, 324 may merge together, which may prevent subsequent removal of a portion of the CESL 330 (block 214). By way of example, the CESL 330 may include AlOx, HfOx, ZrOx, SiN, SiO$_2$, SiCN, SiC, or combinations thereof. In various embodiments, the CESL 330 may be deposited by a SACVD process, a flowable CVD process, an ALD process, a PVD process, or other suitable deposition technique.

In accordance with various embodiments, the snaking CESL 330 enables the use of a single type of hard mask layer (e.g., the hard mask layer 315), thus there is no lack of etch selectivity (e.g., between multiple hard mask layers of different types), there is no need for an additional CMP process thus avoiding unintentional thinning (loss) of the hard mask layer 315, and the etch process is thus more reliable. The snaking CESL 330 additionally provides for increased protection of the metal gate sidewall spacer (e.g., the sidewall spacer layer 316), thereby mitigating potential voltage breakdown of the sidewall spacer layer 316.

The method 200 proceeds to block 210 where a dielectric layer is deposited over the substrate. Referring to FIGS. 6 and 7, and in an embodiment of block 210, a dielectric layer 332 is formed over the substrate 302. In particular, and in various embodiments, the dielectric layer 332 may be formed over the snaking CESL 330 both inside and outside of the enlarged trenches 322, 324. In some embodiments, the dielectric layer 332 may include an ILD layer that may include materials such as tetraethylorthosilicate (TEOS) oxide, undoped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In various embodiments, the dielectric layer 332 may be deposited by a SACVD process, a flowable CVD process, an ALD process, a PVD process, or other suitable deposition technique.

The method 200 proceeds to block 212 where a contact via opening is formed. With reference to FIGS. 7 and 8, and in an embodiment of block 212, a contact via opening 334 is formed within the dielectric layer 332. By way of example, the contact via opening 334 may be formed by a suitable combination of lithographic patterning and etching (e.g., wet or dry etching) processes. In some embodiments, the etching process used to etch the dielectric layer 332 may stop on the snaking CESL 330. Stated another way, the etching process may include a selective etching process that etches the dielectric layer 332 without substantially etching the snaking CESL 330. Thus, formation of the contact via opening 334 may serve to expose a portion of the underlying CESL 330. In some embodiments, the contact via opening 334 may be substantially aligned with the source/drain contact 328 that is disposed beneath the contact via opening 334 and beneath the enlarged trench 322. In some examples, the contact via opening 334 may have a width 'W1' in a range of between about 10 nm-40 nm and a height 'H2' in a range of between about 30 nm-100 nm. In some embodiments, if the width 'W1' is greater than about 40 nm, the contact via opening 334 will be larger and may overlap an adjacent source/drain contact 328, 329. In some cases, if the width 'W1' is less than about 10 nm, the electrical resistance of a metal layer formed in the contact via opening 334 may be increased, resulting in a circuit time delay. In some embodiments, if the height 'H2' is outside of the range of between about 30 nm-100 nm, a surface topography may become worse for a subsequent via final CMP process. In various embodiments, the width 'W1' of the contact via opening 334 is also greater than a width 'W2' of the enlarged trench 322, thereby providing an opening for a contact via with a large critical dimension (CD) to improve metal gap fill and lower resistance. Further, in some embodiments, the contact via opening 334 may include tapered sidewalls 336.

The method 200 proceeds to block 214 where a CESL breakthrough process is performed. The CESL breakthrough process may equivalently be referred to as an etching process. With reference to FIGS. 8, 9, and 10, and in an embodiment of block 214, the etching process (CESL breakthrough process) is performed to etch the portion of the CESL 330 exposed by formation of the contact via opening 334 (block 212) to form an enlarged contact via opening 335. The etching process of block 214 may include a wet etching process, a dry etching process, or a combination thereof. In some embodiments, the etching process of block 214 may be selective to the CESL 330. Stated another way, the etching process of block 214 may etch the CESL 330 without substantially etching other nearby layers (e.g., such as the glue or barrier layer 326, the metal layer 328, the sidewall spacer layers 316, 318, the hard mask layer 315, or the dielectric layer 332). Generally, the etching process of block 214 may serve to expose the metal layer 328. However, in some cases and depending partly on the type of etch (e.g., wet or dry etch) used for the etching process of block 214, portions of other layers may also be exposed. Of note, use of the single type of hard mask layer (e.g., the hard mask layer 315), enabled by the snaking CESL 330, avoids the lack of etch selectivity seen when multiple hard mask layer types are used. As a result, the etching process (CESL breakthrough process) of block 214 is more reliable, with the sidewall spacer layers 316, 318, and especially the metal gate layer 314 of the gate structures 304, 306, 308, remain protected.

For purposes of illustration, the example of FIG. 9 shows a case of using a dry etching process, and the example of FIG. 10 shows a case of using a wet etching process. While both the dry etching and wet etching processes are selective to the CESL 330, there may be some differences (e.g., which may appear as structural differences in the device 300). For the case of the dry etching process (FIG. 9), the etch of the CESL 330 may include a timed etch process. In other words, the dry etch process is controlled by a time (duration) of the dry etch. In some examples, the time (duration) of the dry etch process is dependent on the CESL 330 thickness 'T1' and may be in a range of about 30-300 seconds. In some embodiments, after performing such a dry etching process, portions 330a of the CESL 330 may remain on sidewalls of a lower portion of the enlarged contact via opening 335 (e.g., on sidewall surfaces of the sidewall spacer layer 316). The portions 330a of the CESL 330 may, in some embodiments, provide additional protection to the sidewall spacer layer 316 to mitigate potential voltage breakdown. In some cases, a thickness 'T2' of the portions 330a may be in a range of between about 1 nm-10 nm. In some examples, the thickness 'T2' may depend on the CESL 330 thickness 'T1' and on the sidewall loss of the CESL 330 during the CESL breakthrough process. In addition to exposing the metal layer 328, the dry etching process may also expose portions of the glue or barrier layer 326, top surfaces of the sidewall spacer layer 316 and/or the sidewall spacer layer 318, and the hard mask layer 315 (e.g., over the gate structure 306). For the case of the wet etching process (FIG. 10), the CESL 330 is substantially removed from the enlarged contact via opening 335 without leaving unetched portions of the CESL 330 within the enlarged contact via opening 335. In addition to exposing the metal layer 328, the wet etching process may also expose portions of the glue or barrier layer 326, sidewall and top surfaces of the sidewall spacer layer 316, top surfaces of the sidewall spacer layer 318, and the hard mask layer 315 (e.g., over the gate structure 306).

As noted above, portions 330a of the CESL 330 may remain after the dry etching process. As a result, if the via CD (e.g., CD of the enlarged contact via opening 335) is too small to provide for sufficient metal fill of a subsequently deposited metal layer (e.g., a metal layer 340), then the wet etching process may be used instead of the dry etching process. However, in some cases, if the chemicals used in the wet etching process are likely to attack, and thus damage, the metal used to form the source/drain contacts 328, 329, then the dry etching process may be used instead of the wet etching process. In some embodiments, the dry etching process utilizes an etch gas that includes $CF_4$ or a chlorine-based gas (e.g., such as $Cl_2$ or $BCl_3$) combined with a plasma of Ar, $O_2$, $N_2$, and/or $H_2$. In some cases, the wet etching process utilizes HCl, $H_3PO_4$, $CH_3COOH$, $HNO_3$, or a combination thereof.

The method 200 proceeds to block 216 where a glue layer is optionally deposited. For purposes of following discussion, it is assumed that a dry etching process is used to etch the CESL 330 at block 214, such that the portions 330a of the CESL 330 remain on sidewalls of a lower portion of the enlarged contact via opening 335, as discussed above with reference to FIG. 9. With reference to FIGS. 9 and 11, and in an embodiment of block 216, a glue layer 338 is formed over the substrate 302. By way of example, the glue layer 338 may be deposited on a top surface of the device 300, on sidewall surfaces of the enlarged contact via opening 335, and along bottom surfaces of the enlarged contact via opening 335. More specifically, the glue layer 338 may be deposited on surfaces of the dielectric layer 332, on sidewalls of the etched CESL 330 and over the portions 330a of the CESL 330, on various surfaces of the sidewall spacer layers 316, 318, on part of the hard mask layer 315 (over the gate structure 306), on a portion of the glue or barrier layer 326, and on a top surface of the source/drain contact 328. The glue layer 338 may, in various examples, serve to provide oxide layer reduction (e.g., such as native oxide layer reduction), and in some cases to substantially prevent formation of an oxide layer along the top surface of the source/drain contact 328. In some examples, the glue layer 338 may have a thickness 'T3' in a range of between about 0 nm-3 nm along a sidewall of the enlarged contact via opening 335, and a thickness 'T4' in a range of between about 0 nm-8 nm along a top surface of the dielectric layer 332 (outside the enlarged contact via opening 335. In some examples, the thickness variation between 'T3' and 'T4' may come from process variations and/or different via sizes. Thus, the glue layer 338 may have a different step coverage on the top surface of the dielectric layer 332 and within the enlarged contact via opening 335. In some embodiments, if 'T3' is larger than about 3 nm, then voids may be induced in the smaller via within which a subsequent metal layer (e.g., a metal layer 340) is formed. The 0 nm thicknesses may correspond to embodiments where the glue layer 338 is not deposited. In some embodiments, the glue layer 338 may include Ti, TiN, Ta, TaN, W, Ru, $W(CO)_6$, or other appropriate material. In various embodiments, the glue layer 338 may be deposited by CVD, ALD, PVD, or other suitable deposition technique.

The method 200 proceeds to block 218 where a metal layer is deposited. With reference to FIGS. 11 and 12, and in an embodiment of block 218, a metal layer 340 is formed within the enlarged contact via opening 335. In some embodiments, the metal layer 340 is formed over the source/drain contact 328, or over the glue layer 338 optionally formed on the top surface of the source/drain contact 328, to provide a low-resistance electrical connection to the source/drain contact 328. In various examples, the metal layer 340 may provide a contact via, where the contact via provides the electrical connection to the source/drain contact 328. In some examples, the metal layer 340 may include W, Cu, Co, Ru, Al, Rh, Mo, Ta, Ti, or other conductive material. By way of example, deposition of the metal layer 340 may be performed using ALD, CVD, PVD, or other appropriate technique.

Figure 13:
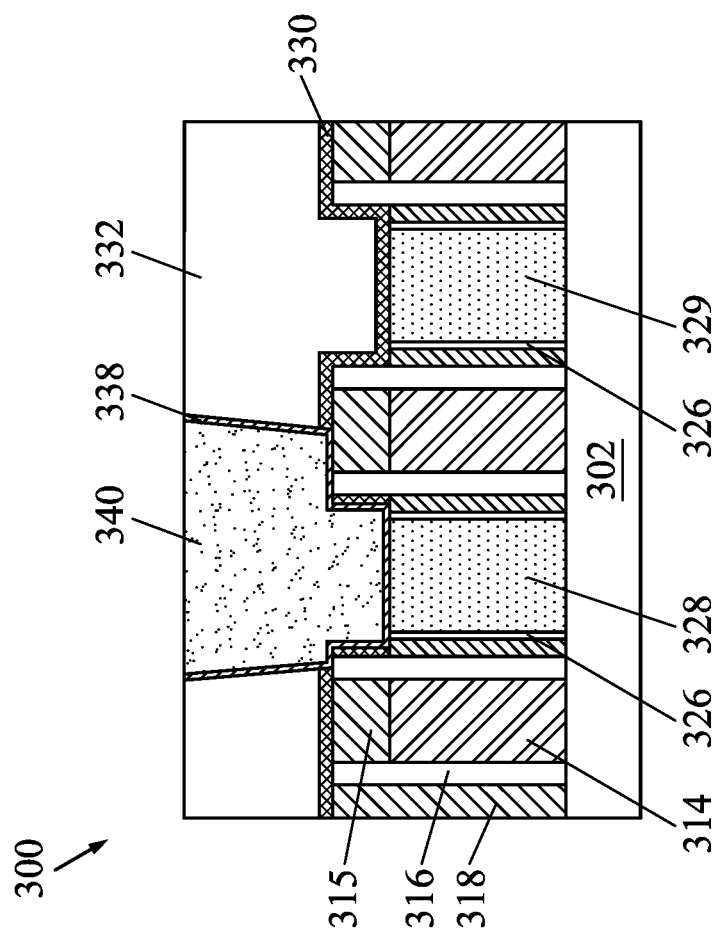

The method 200 proceeds to block 220 where a CMP process is performed. With reference to FIGS. 12 and 13, after deposition of the metal layer 340 and in an embodiment of block 220, a CMP process may be performed to remove excess material and planarize the top surface of the device 300. In various embodiments, the CMP process may be performed until the portions of the metal layer 340 and the glue layer 338 that are outside of the enlarged contact via opening 335 are removed. In other words, the CMP process is performed until the top surface of the dielectric layer 332 is exposed. After the CMP process, top surfaces of the dielectric layer 332, the metal layer 340, and ends of the glue layer 338 are substantially level (co-planar) with each other. Thus, in accordance with various embodiments, the large CD of the contact via (the metal layer 340) provides for improved metal gap fill and lower resistance to the source/drain contact 328. It is also noted that while part of the CESL has been etched to provide the contact via (e.g., the metal layer 340) coupled to the source/drain contact 328, as described above, another part of the CESL may remain unetched over another source/drain contact (e.g., such as the source/drain contact 329). Thus, at least part of the snaking CESL 330 may remain in the final structure of the device 300.

The device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features (e.g., including the contact vias discussed above, and gate vias to provide electrical contact to the metal gate layer 314 of the gate structures 304, 306, 308) to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

While the example discussed above with reference to the method 200 was described as using a single CESL layer (e.g., the snaking CESL 330), other embodiments are possible. For instance, in some cases, two CESL layers may be used. Multiple CESL layers may be used, in some examples, when device geometries are further scaled down and additional etch protection (etch resistance) may be desired. Such an embodiment is described with reference to FIGS. 14 and 15. As shown, the device 300 may include the snaking CESL 330 and the dielectric layer 332, as discussed above. In some cases, the dielectric layer 332 may be etched back to expose top surfaces of the snaking CESL 330. Thereafter, another CESL 333 may be formed over the snaking CESL 330 and the dielectric layer 332. In various cases, the CESL 333 may or may not also include a snaking CESL. In some cases, the CESL 333 may be substantially planar. In some embodiments, the CESL 333 (like the CESL 330) may include AlOx, HfOx, ZrOx, SiN, SiO$_2$, SiCN, SiC, or combinations thereof, and may be deposited by a SACVD process, a flowable CVD process, an ALD process, a PVD process, or other suitable deposition technique. In some cases, the CESL 330 and the CESL 333 have a different etch selectivity. However, in some cases, the CESL 330 and the CESL 333 may have similar etch selectivity. After forming the CESL 333, a dielectric layer 339 may be formed over the CESL 333. The dielectric layer 339, like the dielectric layer 332, may include an ILD layer such as TEOS oxide, undoped silicate glass, or doped silicon oxide such as BPSG, FSG, PSG, BSG, and/or other suitable dielectric materials, and may be deposited by a SACVD process, a flowable CVD process, an ALD process, a PVD process, or other suitable deposition technique. After formation of the dielectric layer 339, processing similar to that described above with reference to the method 200 may be performed. For example, a contact via opening is formed, multiple CESL breakthrough processes may be performed (e.g., for both the CESL 333 and the CESL 330), a glue layer may be optionally deposited, a metal layer is deposited, and a CMP process is performed. An exemplary embodiment of the resulting device 300 is shown in FIG. 15. It is noted that a contact via opening of the device 300 of FIG. 15 may have a width 'W3' that spans a distance greater than an end-to-end distance of two adjacent source/drain contacts, and including a gate structure disposed between the two adjacent source/drain contacts, thereby providing an opening for a contact via with a large critical dimension (CD) to improve metal gap fill and lower resistance.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a fabrication process for contact structures and including contact vias. In at least some embodiments, a contact via may be formed without the use of multiple hard mask layers of different types. In some embodiments, a first hard mask layer is formed over a metal gate, and instead of forming a second hard mask layer over a source/drain contact, the source/drain contact may be etched back to form a substrate topography that includes a plurality of trenches interposing the first hard mask layer. A snaking CESL is then formed conformally over the substrate topography. After forming the snaking CESL, a dielectric layer may be formed, a via trench is formed, and a metal layer is deposited in the via trench to form a conductive contact via. By employing the snaking CESL, which enables the use of a single hard mask layer, there is no lack of etch selectivity (e.g., between multiple hard mask layers of different types) and the etch process is thus more reliable. Further, use of the single hard mask layer also removes the need for an additional CMP process, thereby avoiding the unintentional thinning (loss) of the hard mask. The snaking CESL additionally provides for increased protection of the metal gate sidewall spacer, mitigating potential voltage breakdown of the sidewall spacer. Thus, the embodiments disclosed herein provide for a more reliable, low-resistance contact via with a large CD (e.g., made possible by the snaking CESL), where the low-resistance contact via may be formed at a reduced cost (e.g., by eliminating the additional hard mask layer and associated process steps).

Thus, one of the embodiments of the present disclosure described a method for fabricating a semiconductor device including etching back a source/drain contact to define a substrate topography including a trench disposed between adjacent hard mask layers. In some embodiments, the method further includes depositing a contact etch stop layer (CESL) along sidewall and bottom surfaces of the trench, and over the adjacent hard mask layers, to provide the CESL having a snake-like pattern disposed over the substrate topography. In some examples, the method further includes forming a contact via opening in a dielectric layer disposed over the CESL, where the contact via opening exposes a portion of the CESL within the trench. In some embodiments, the method further includes etching the portion of the CESL exposed by the contact via opening to form an enlarged contact via opening and expose the etched back source/drain contact. In some cases, the method further includes depositing a metal layer within the enlarged contact via opening to provide a contact via in contact with the exposed etched back source/drain contact.

In another of the embodiments, discussed is a method including providing a substrate including a gate structure and source/drain contacts disposed on either side of the gate structure. In some embodiments, the method further includes performing a plurality of etch back processes to form trenches over the source/drain contacts on opposite sides of the gate structure. By way of example, the method further includes forming a contact etch stop layer (CESL) within the trenches and over the gate structure to define a snaking CESL disposed over the substrate. In some cases, the method further includes performing a CESL breakthrough process to expose at least one of the source/drain contacts adjacent to the gate structure. In various embodiments, the method further includes forming a metal layer in contact with the at least one exposed source/drain contacts adjacent to the gate structure.

In yet another of the embodiments, discussed is a semiconductor device including a first source/drain contact and a second source/drain contact disposed adjacent to and on opposite sides of a gate structure, where each of the first source/drain contact and the second source/drain contact is recessed with respect to a hard mask layer disposed over the gate structure. In some embodiments, the semiconductor device further includes a contact via disposed over the first source/drain contact, and over a first part of the hard mask layer, to provide an electrical connection to the first source/drain contact. In addition, and in some cases, the semiconductor device further includes a snaking contact etch stop layer (CESL) disposed over the second source/drain contact and over a second part of the hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   etching back a source/drain contact to define a substrate topography including a trench disposed between adjacent hard mask layers;
   depositing a contact etch stop layer (CESL) along sidewall and bottom surfaces of the trench, and over the adjacent hard mask layers, to provide the CESL having a snake-like pattern disposed over the substrate topography;
   forming a contact via opening in a dielectric layer disposed over the CESL, wherein the contact via opening exposes a portion of the CESL within the trench;
   etching the portion of the CESL exposed by the contact via opening to form an enlarged contact via opening and expose the etched back source/drain contact; and
   depositing a metal layer within the enlarged contact via opening to provide a contact via in contact with the exposed etched back source/drain contact.

2. The method of claim 1, further comprising:
   prior to depositing the CESL, etching back a sidewall spacer layer on either side of the etched back source/drain contact to provide an enlarged trench disposed between the adjacent hard mask layers.

3. The method of claim 2, wherein the depositing the CESL includes depositing the CESL along sidewall and bottom surfaces of the enlarged trench, and over the adjacent hard mask layers, to provide the CESL having the snake-like pattern.

4. The method of claim 2, wherein the contact via opening has a first width greater than a second width of the enlarged trench.

5. The method of claim 2, wherein the etched back sidewall spacer layer is substantially level with the etched back source/drain contact.

6. The method of claim 1, wherein the etching the portion of the CESL exposed by the contact via opening to form the enlarged contact via opening includes performing a timed dry etching process.

7. The method of claim 6, wherein after performing the timed dry etching process, portions of the CESL remain on sidewalls of a lower portion of the enlarged contact via opening.

8. The method of claim 1, further comprising:
   prior to depositing the metal layer, depositing a glue layer within the enlarged contact via opening; and
   depositing the metal layer over the glue layer.

9. The method of claim 1, further comprising:
   prior to forming the contact via opening, depositing the dielectric layer over the CESL.

10. The method of claim 1, further comprising:
    after depositing the metal layer, performing a chemical mechanical polishing (CMP) process to remove excess material and planarize a top surface of the semiconductor device.

11. A method, comprising:
    providing a substrate including a gate structure and source/drain contacts disposed on either side of the gate structure;
    performing a plurality of etch back processes to form trenches over the source/drain contacts on opposite sides of the gate structure;
    forming a contact etch stop layer (CESL) within the trenches and over the gate structure to define a snaking CESL disposed over the substrate;
    after depositing a dielectric layer over the snaking CESL, performing a CESL breakthrough process to expose at least one of the source/drain contacts adjacent to the gate structure; and
    forming a metal layer in contact with the at least one exposed source/drain contacts adjacent to the gate structure.

12. The method of claim 11, wherein a first etch back process of the plurality of etch back processes recesses the source/drain contacts disposed on either side of the gate structure.

13. The method of claim 12, wherein a second etch back process of the plurality of etch back processes recesses a sidewall spacer layer adjacent to the recessed source/drain contacts.

14. The method of claim 13, wherein the first etch back process forms the trenches, and wherein the second etch back process enlarges the trenches.

15. The method of claim 11, further comprising:
    prior to performing the CESL breakthrough process, etching the dielectric layer to form a contact via opening that exposes a first portion of the CESL over the at least one of the source/drain contacts adjacent to the gate structure.

16. The method of claim 15, wherein the contact via opening further exposes a second portion of the CESL over a hard mask layer disposed on the adjacent gate structure.

17. The method of claim 15, wherein after performing the CESL breakthrough process and prior to forming the metal layer, portions of the snaking CESL remain on sidewalls of a lower portion of the contact via opening.

18. A method, comprising:
    forming a plurality of trenches interposing adjacent hard mask layers to define a substrate topography having a snake-like pattern;
    depositing a contact etch stop layer (CESL) conformally over the substrate topography, the conformally deposited CESL having the snake-like pattern of the substrate topography;
    etching a portion of the CESL within one of the plurality of trenches to expose a source/drain contact; and
    forming a metal layer within the one of the plurality of trenches and in contact with the exposed source/drain contact.

19. The method of claim 18, further comprising:
    prior to forming the metal layer, depositing a glue layer within the one of the plurality of trenches and in contact with the exposed source/drain contact; and
    forming the metal layer over the glue layer.

20. The method of claim 18, wherein at least some of the CESL remains on sidewalls of the one of the plurality of trenches after etching the portion of the CESL.

* * * * *